United States Patent

[11] 3,534,756

[72] Inventor Elmer L. Swartz
Falls Church, Virginia

[21] Appl. No. 721,687
[22] Filed April 16, 1968
[45] Patented Oct. 20, 1970
[73] Assignee The United States of America as represented by the Secretary of the Army

[54] FLUID BINARY COUNTER STAGE
8 Claims, 6 Drawing Figs.

[52] U.S. Cl. .......... 137/81.5, 235/201
[51] Int. Cl. .......... F15c 1/12
[50] Field of Search .......... 137/81.5; 235/201

[56] References Cited

UNITED STATES PATENTS

| | | | |
|---|---|---|---|
| 3,226,023 | 12/1965 | Horton | 137/81.5X |
| 3,228,410 | 1/1966 | Warren et al. | 137/81.5 |
| 3,232,305 | 2/1966 | Groeber | 137/81.5 |
| 3,275,016 | 9/1966 | Wood | 137/81.5 |
| 3,402,727 | 9/1968 | Boothe | 137/81.5 |
| 3,425,432 | 2/1969 | Langley | 137/81.5 |

*Primary Examiner*—Samuel Scott
*Attorneys*—Harry M. Saragovitz, Edward J. Kelly, Herbert Berl and Gerald L. Lett ABSTRACT: A fluid binary counter stage in which a fluid pulse converter directs an incoming pulse to the proper control channel of a bistable fluid amplifier in order to cause a change in state of the amplifier and in which feedback channels are provided between the output channels of the bistable amplifier and the control channels of the amplifier to increase the pressure differential between control channels. A plurality of these stages may be cascaded to provide a complete binary counter. A reset input is provided and communicates directly with the control channels of the bistable amplifiers in each counter stage.

INVENTOR
ELMER L. SWARTZ

BY Harry M. Saragovitz, Edward J. Kelly, Herbert Berl & Gerald L. Lett
ATTORNEYS

INVENTOR
ELMER L. SWARTZ

BY Harry M. Saragovitz, Edward J. Kelly, Herbert Berl & Gerald L. Zett ATTORNEYS

FLUID BINARY COUNTER STAGE

The invention described herein may be manufactured, used, and licensed by or for the Government for governmental purposes without the payment to me of any royalty thereon.

BACKGROUND OF THE INVENTION

Bistable fluid amplifiers have been extensively used in digital circuits employing fluidic techniques. The bistable fluid amplifier utilized is preferably one which uses the boundary layer lock-on effect. In a boundary layer controlled fluid amplifier a high energy power jet is directed towards a target area or receiving aperture system by the pressure distribution in the power jet boundary layer region. This pressure distribution is controlled by the wall configuration of the interaction chamber, the power jet energy level, the fluid transport characteristics, the back loading of the amplifier output passages and the flow of control fluid to the power jet boundary layer region. In this type of fluid amplifier special design of the interaction chamber configuration permits designs where the power jet will lock on to one sidewall and remain in the locked-on flow configuration without a control fluid flow. When the power jet is suitably deflected by a control fluid flow, it can lock on to the opposite sidewall and remain in the locked-on flow configuration even after the control fluid flow is stopped. Bistable amplifiers utilizing the boundary layer lock-on effect control the delivery of energy of a main stream of fluid to an outlet orifice or utilization device by means of a control fluid flow issuing from a control nozzle generally at right angles to the main stream. The proportion of the relatively high energy main stream delivered to an orifice may be varied as a linear or nonlinear function of the relatively low energy of a control stream interacting therewith. Since the energy of the main stream is larger than the control energies supplied, an energy gain is realized and amplification in a conventional sense is realized. The bistable fluid amplifier of this type is, in addition, provided with memory characteristics. These amplifiers are designed so that the fluid stream flowing through the amplifier will persist in trying to exhaust into that aperture through which it is initially directed by fluid flow from one of the control nozzles, even after the control fluid flow has ceased and despite partial or complete blockage of discharge from that aperture.

In some applications such as scalars or fluid digital counters it is required that the successive switching of the fluid flowing through the bistable amplifier from one aperture the opposite aperture occur in response to successive fluid pulses received from some common source.

It was not until the invention of the Fluid Pulse Converter by Raymond W. Warren, described in U.S. Pat. No. 3,001,698 issued on Sept. 26, 1961, that it was possible to operate a bistable fluid amplifier with alternating fluid pulses from a single source. Utilizing this fluid pulse converter, a pair of substantially opposed control nozzles of a bistable fluid amplifier are connected to a novel tube system so that a pressure differential is created in the tube system when a power jet flowing between the nozzles more closely approaches one control nozzle than the other. This pressure differential is used to steer sequential pulses injected into the tube system into the one control nozzle so that the fluid flowing between the nozzles will be deflected by the one control nozzle towards the other control nozzle. Sequential fluid pulses can thereby be converted into alternating fluid pulses. The fluid converter which performs this conversion function has no moving parts other than the moving fluid employed therein. By suitably connecting two or more of these fluid amplifier-pulse converter combinations together a binary counter or computer can be provided which will function with no moving elements or parts.

In designing a binary counter state of the type hereinabove described three main problems are encountered. (1) There must be sufficient pressure at the output of one stage to drive a successive stage. (2) Pressures in the right and left control channels of the main amplifier must show a differential that will guide the signal from the pulse converter to the proper channel at high frequency without error. (3) Some provision must be made to easily zero set a counter stage at anytime.

The first two problems above mentioned have been separately solved in the past by using amplifiers having mutually exclusive characteristics. That is, a high pressure recovery amplifier has inherently a small pressure differential between the controls. Amplifiers with a large differential control pressure generally have medium pressure recovery at best. Since it has not been possible before to have both of these characteristics in a single unit and maintain operation over a wide range of power, pressure and frequency, most designers have incorporated one or more additional amplifiers.

Provision for a reset has always been the particular problem in fluidic counter circuits. One design used in the past utilized a second set of controls. These extra slots greatly reduced the overall efficiency of the system requiring additional amplification. Another method was to inject the reset signal directly into the control channel. Of course, this presents a problem that the reset signal input channel must be completely shutoff when not in use and obviously this calls for a moving part in the form of a valve.

Another problem encountered in fluid binary counter stages of the type herein discussed is the instability caused by the rarefaction wave. Such waves exist in devices of this nature because the output of a high gain device of one stage is coupled directly to the pulse converter of the next stage. The result will be that the rarefaction wave will cause the driven amplifier to switch spuriously.

It is therefore an object of this invention to provide a fluid binary counter stage into which reset signals can be injected without using extra control channel and without requiring means to close off the source of the reset signal.

It is another object of this invention to provide a fluid binary counter stage in which high pressure recovery amplifiers may be used while maintaining a large differential control pressure.

Still another object of this invention is to provide a fluid binary counter stage consuming less power and requiring less space per stage.

An additional object of this invention is to provide a fluid binary counter stage which is not subject to spurious switching caused by a rarefaction wave.

SUMMARY OF THE INVENTION

The aforementioned and other objects have been attained by using a high pressure recovery bistable amplifier with a feedback channel connecting the output and the control channel on a given side of the amplifier. When there is flow through an output channel, a portion of that output flow will be directed into the feedback channel. The feedback flow, a small portion of the flow on the active output side, is used as an aspirating signal to further decrease the pressure in the control channel on the operating side of the amplifier. The opposite or nonoperating control channel now also has access to the atmosphere through the feedback exhaust which tends to satisfy most of the negative pressure in the channel. By this means a large pressure difference can now be realized between the control channels resulting in an increased stability of the main power stream attachment. A reset signal can be injected simply by applying a small pressure signal at the aspirator control which will set the stage to zero as power is applied. If the power is already on, the function can still be performed in the same manner but slightly more reset pressure will be required. Reset may be accomplished, as well, by applying pressure to the opposite control channel setting the counter stage to one and applying a pulse at the pulse converter input.

BRIEF DESCRIPTION OF THE DRAWINGS

The specific nature of the invention as well as other objects, aspects, uses, and advantages thereof will clearly appear from the following description and from the accompanying drawing in which.

DESCRIPTION OF THE PREFERRED EMBODIMENT

Figure 1:
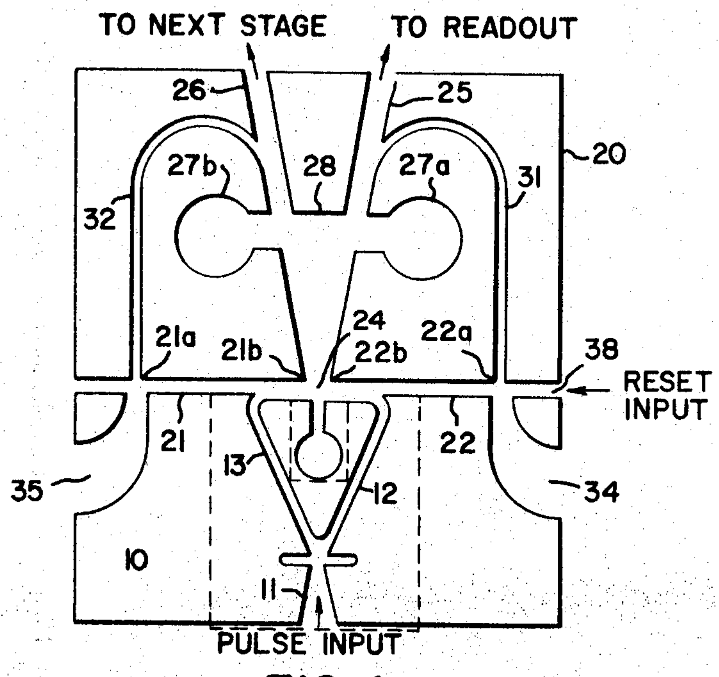
FIG. 1 is a plan view of the preferred embodiment of my invention.

In FIG. 1 is shown the preferred embodiment of the fluid binary counter stage of my invention basically comprising a pulse converter 10, within the dotted lines, and a bistable fluid amplifier 20. Pulse converter 10 includes an input channel 11 adapted to receive an input pulse either from a preceding stage or another input source. Input channel 11 divides to form channels 12 and 13 which communicate respectively with control channels 22 and 21 of bistable fluid amplifier 20.

The bistable amplifier 20 is of the type discussed hereinabove. A power fluid stream is obtained from power input 23 and is directed to interaction chamber 24 where control inputs from either control channel 21 or 22 will impinge upon it and deflect it. The deflected power stream will then proceed out one of the output channels 25 or 26. Orifices **27*a* and 27*b* provide a bleed to the atmosphere, the purpose of which will become more apparent from the description herein below. A feedback channel 31 connects output channel 25 to control channel 22 at 22*a*. An aspirator 34 connects junction point 22*a* to the atmosphere and a reset input 38 is connected to junction point 22*a* as well. In a like manner feedback channel 32 connects output channel 26 to control channel 21 at junction point 21*a* which communicates with the atmosphere through aspirator 35**.

Figure 2:
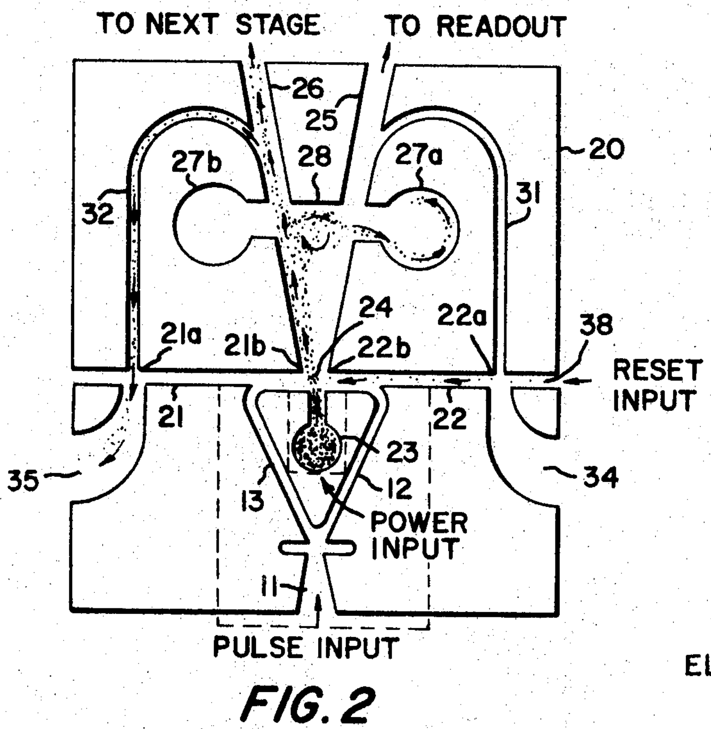
FIG. 2 is a plan view of the preferred embodiment of my invention illustrating fluid flow upon application of the power fluid and the small reset pressure.

FIG. 2 illustrates fluid flow in the binary counter stage upon application of a power jet and a small reset pressure. The power jet is applied to power input 23 and reset signal is applied to reset input 38. The reset signal flowing through control channel 22 will impinge upon the power signal in interaction chamber 24 causing the power signal to be deflected through output channel 26. At this point, the reset signal may be removed and, because of the boundary layer lock-on effect discussed above, the power signal will continue to flow through output channel 26. In order to enhance this lock-on effect fluid splitter 28 is shaped to form a vortex which will tend to hold the power stream in the operating channel in this case output channel 26. In order to maintain this vortex it is necessary that there be communication with the atmosphere at this point and this is provided in this operating mode by atmospheric bleed **27*a*. If the fluid flow was directed through output channel 25 atmospheric bleed 27*b*** would be used to maintain the vortex.

A portion of the power fluid flowing out through channel 26 is diverted through feedback channel 32 and is also to the atmosphere through aspirator 35.

Because of the fluid flow past orifice **21*b* of control channel 21, a low pressure region will be created in control channel 21 of the bistable amplifier and channel 13 of the pulse converter. The fluid flow through feedback loop 32 will enhance this low pressure region in its flow past junction point 21*a* to the atmosphere through aspirator 35. Not only does this low pressure region created in control channel 21 enhance the lock-on effect, but it significantly increases the pressure differential between control channels 22 and 21**. The binary counter stage is now ready to receive a first input pulse.

Figures 3, 4, 6:
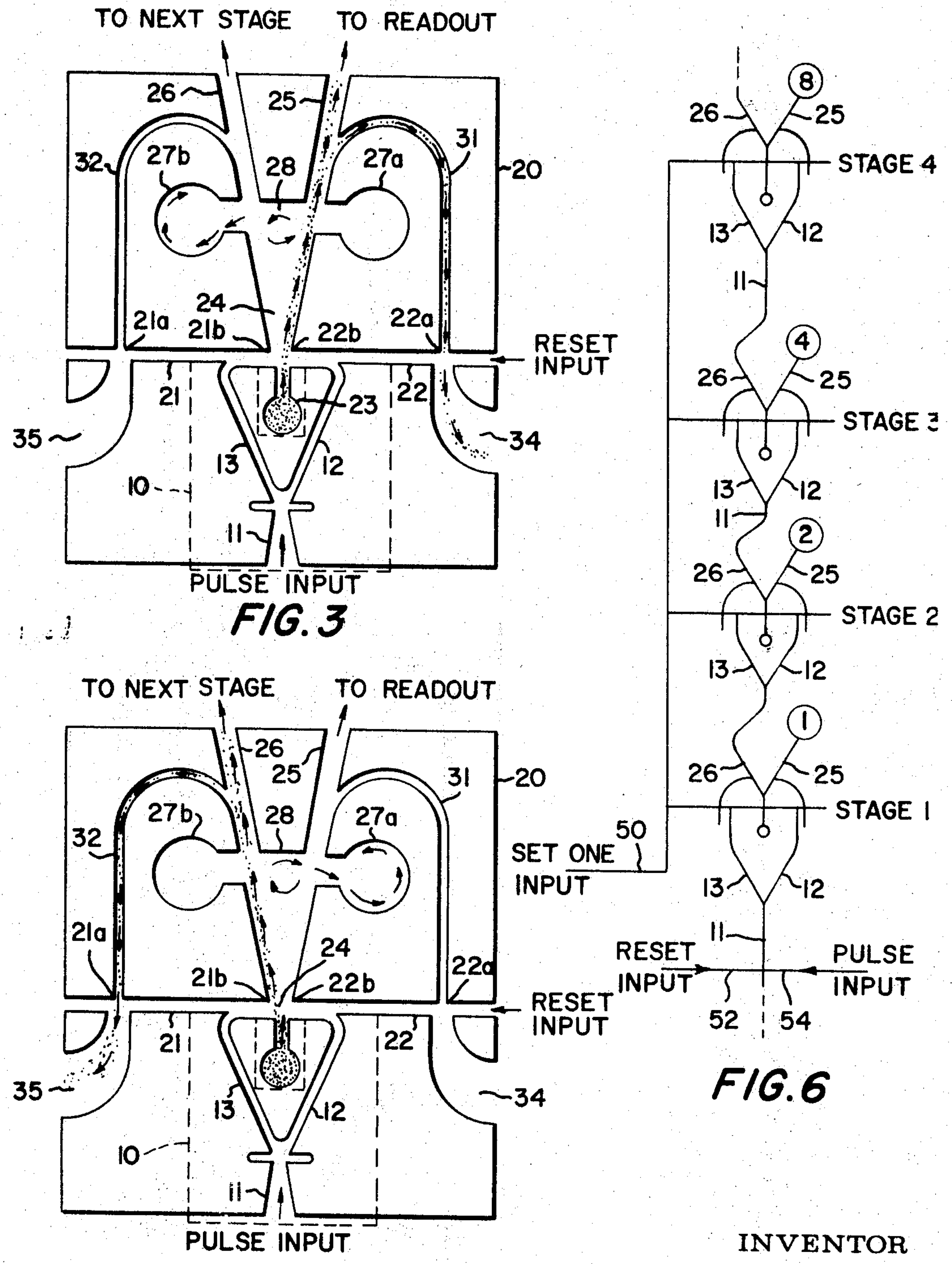
FIG. 3 is a plan view of the preferred embodiment of my invention illustrating fluid flow upon the application of a first input pulse.
FIG. 4 is a plan view of the preferred embodiment of my invention illustrating fluid flow upon application of a second input pulse.
FIG. 6 is a schematic illustration of the counter of FIG. 5 employing an alternate reset means.

FIG. 3 illustrates the fluid flow in the binary counter stage upon application of a first input pulse. The pulse will enter input channel 11 and be directed to channel 13 because of the low pressure region created therein by the fluid flow described with reference to FIG. 2. The pulse will be directed into channel 13 without the possibility of error because of the enhancement of the low pressure region caused by flow through the feedback channel 32 as described in FIG. 2. The pulse emanating from channel 13 into control channel 21 will deflect the power stream from output channel 26 to output channel 25. Because fluid flow is now directed to the readout means, that means will change from a zero state to a one state. Again, the lock-on effect is assisted by the vortex at splitter 28 which in turn is maintained by the atmospheric bleed **27*b***.

In the same manner as discussed in FIG. 2 a portion of the power fluid is diverted through feedback channel 31. When this fluid flows past junction point **22*a* it will further decrease the pressure in the low pressure region created in control channel 22 by the power stream flow past orifice 22*b*. The flow through feedback channel 31 is conducted to the atmosphere through exhaust channel 34**.

In FIG. 4 is illustrated the flow pattern in the fluid binary counter stage when a second input pulse is applied. The input pulse entering channel 11 will be directed into channel 12 because of the very low pressure which existed in that channel caused by the flow pattern discussed in FIG. 3. The pulse emanating from channel 12 into control channel 22 will cause the power stream to be deflected from output channel 25 to output channel 26. The readout means will, of course, transfer from the one state to the zero state, and the signal from channel 26 will be directed to the next fluid binary counter stage. The fluid flow after application of the second pulse will be the same as that discussed in FIG. 2. A low pressure region will be created in control channel 21 and channel 13 of pulse converter 10 so that the next incoming pulse will be directed into channel 13.

By the device of using a feedback fluid flow, as described above, I have been able to significantly increase the pressure differential between the control channels of the bistable amplifier and the output channels of the pulse converter so that an input signal can be guided from the pulse converter to the proper control channel of the bistable amplifier without error at relatively high frequencies. It is apparent that high pressure recovery fluid amplifiers may be used in my invention because they will have no significant effect on this pressure differential so long as the feedback is properly adjusted. The binary counter stage can easily be set to zero by injecting a pulse of relatively low pressure into reset input 38. Switching is readily accomplished because of the large pressure differential between the control channels created as discussed above. Spurious switching caused by the rarefaction wave is eliminated, because the rarefaction wave is satisfied by entrainment by contacting the atmosphere through the feedback loop exhaust.

Figure 5:
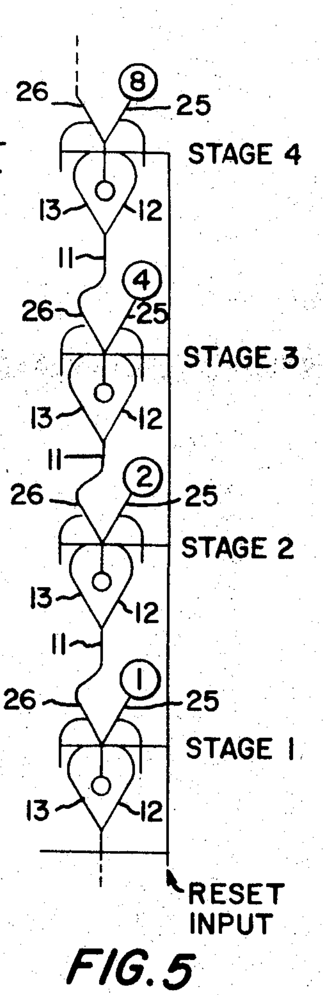
FIG. 5 is a schematic illustration of a plurality of the fluid binary counter stages of my invention cascaded to form a binary counter.

FIG. 5 illustrates four of the fluid by counter stages of my invention cascaded to form a binary counter. Because high pressure recovery amplifiers can be used satisfactorily in the counter stage of my invention, while maintaining operation over a wide range of power, pressure and frequency, the output of each stage will work directly into the input of the next stage without further intermediate amplification.

Assuming that the counter of FIG. 5 has been reset according to the operation described in conjunction with FIG. 2 a pulse input to input channel 11 of stage 1 will cause an output signal to be directed out output channel 25 of stage 1 causing that stage to switch from the zero to the one state. This phase of the operation of the counter stage is described in FIG. 3. A second input pulse to channel 11 or stage 1 will cause stage 1 to switch from the one state to the zero state and cause an output pulse to emanate from output channel 26 of stage 1 into input channel 11 of stage 2. This, of course, will cause stage 2 to switch from the zero to the one state because the input pulse thereto will be directed through channel 13 and out channel 25. Further pulses coupled to input channel 11 of stage 1 will cause the successive stages of the counter to operate in a manner described hereinabove for the first two stages.

In FIG. 6 the fluid binary counter circuit described in FIG. 5 is shown with an alternate means for accomplishing the reset function. In this embodiment, in order to reset the counter to zero, a pulse is applied to set "one" input 50 and into a control channel of each of the bistable amplifiers. This will result in each stage of the counter being set to the one state. At this time a single pulse is applied to reset input 52 and through pulse converter input 11. causing each of the stages to switch successively to the zero state. While this reset means is slightly more cumbersome, it has the advantage that with every reset operation it will cause a complete check to be made upon the operation of the counter.

It is apparent that the fluid binary counter states of this invention may also be employed in other and different fluid systems singly or in combination whereever their unique characteristics may be advantageously utilized. It is further apparent that the embodiment shown is only exemplary and that various modifications can be made in construction and arrangement within the scope of the invention as described in the appended claims.

I claim:

1. A fluid binary counter stage, comprising:

a. a bistable fluid amplifier in which a pair of control channels are positioned to alternately deflect a fluid stream flowing through said amplifier to one of a pair of output channels as a result of said control channels issuing alternating fluid jets;

b. a pair of tubes joined at one end and connected to said control channels at an other end for creating a pressure differential between said control channels as a result of said fluid stream being deflected closer to one control channel than the other;

c. pulse input means for injecting sequential fluid pulses into said pair of tubes such that said pressure differential will cause sequential fluid pulses received by said pair of tubes to issue alternately from each control channel of said pair; and d. feedback means communicating with said control channels and adapted to divert a portion of said fluid stream from either of said output channels for use as an aspirating signal to further increase the pressure differential between said control channels.

2. The fluid binary counter stage of claim 1 in which said bistable fluid amplifier is a high pressure recovery amplifier.

3. The fluid binary counter stage of claim 1 having a means for setting said counter stage to the one binary state and means for applying a reset pulse into said pulse input means.

4. The fluid binary counter stage of claim 1 in which a reset signal input means is connected directly to one of said control channels so that a small pressure signal may be injected therein to reset said binary counter stage to zero, said reset input means requiring no shutoff valve or other controls.

5. The fluid binary counter stage of claim 4 in which said bistable fluid amplifier is a high pressure recovery amplifier.

6. A fluid binary counter stage, comprising:

a fluidic pulse converter having an input channel and first and second output channels;

a bistable fluid amplifier having first and second output channels, first and second control channels and a source a power fluid, said first output channel of said pulse converter being connected to said first control channel and said second output channel of said pulse converter being connected to said second control channel;

a first feedback channel means connecting said first output channel of said bistable amplifier to said first control channel and from that point communicating with the atmosphere;

a second feedback channel means connecting said second output channel of said bistable amplifier to said second control channel and from that point communicating with the atmosphere; and a conduit provided to inject a reset signal into one of said control channels, said conduit being connected to the point at which one of said feedback channels intercepts one of said control channels.

7. The fluid binary counter stage of claim 6 in which said bistable fluid amplifier is a high pressure recovery amplifier.

8. A fluid binary counter comprising a plurality of fluid binary stages, each of said binary stages comprising:

a fluidic pulse converter having an input channel and first and second output channels;

a bistable fluid amplifier having first and second output channels, first and second control channels and a source of power fluid, said first output channel of said pulse converter being connected to said first control channel and said second output channel of said pulse converter being connected to said second control channel;

a first feedback channel means connecting said first output channel of said bistable amplifier to said first control channel and from that point communicating with the atmosphere;

a second feedback channel means connecting said second output channel of said bistable amplifier to said second control channel and from that point communicating with the atmosphere; and a conduit provided to inject a reset signal into one of said control channels, said conduit being connected to the point at which one of said feedback channel means intercepts one of said control channels; and wherein the first output channels of said bistable amplifier of each stage is connected to said input channel means of said pulse converter of the next succeeding stage, said second output channels of said bistable amplifier of each of said stages being connected to a readout means and each of said reset input conduit means being connected in parallel to a reset input signal source.